United States Patent
Ohtsuka et al.

(10) Patent No.: US 7,834,419 B2
(45) Date of Patent: Nov. 16, 2010

(54) SEMICONDUCTOR DEVICE AND METHOD FOR FABRICATING THE SAME

(75) Inventors: Takashi Ohtsuka, Toyama (JP); Takashi Nakabayashi, Toyama (JP); Yoshiyuki Shibata, Shiga (JP)

(73) Assignee: Panasonic Corporation, Osaka (JP)

( * ) Notice: Subject to any disclaimer, the term of this patent is extended or adjusted under 35 U.S.C. 154(b) by 324 days.

(21) Appl. No.: 11/522,982

(22) Filed: Sep. 19, 2006

(65) Prior Publication Data

US 2007/0131997 A1 Jun. 14, 2007

(30) Foreign Application Priority Data

Dec. 8, 2005 (JP) .............................. 2005-354495

(51) Int. Cl.
*H01L 29/00* (2006.01)
(52) U.S. Cl. .................. 257/532; 257/300; 257/528; 438/171; 438/190
(58) Field of Classification Search ................. 257/300, 257/915, E27.016, E27.017, 528, 532; 219/121; 438/3, 171, 190; 361/321
See application file for complete search history.

(56) References Cited

U.S. PATENT DOCUMENTS

| | | | | |
|---|---|---|---|---|
| 3,578,943 A | * | 5/1971 | Schoumaker | 219/121.47 |
| 5,754,390 A | * | 5/1998 | Sandhu et al. | 361/321.4 |
| 5,909,620 A | * | 6/1999 | Wu | 438/253 |
| 6,087,694 A | * | 7/2000 | Ohno et al. | 257/306 |
| 6,133,088 A | * | 10/2000 | Lou | 438/253 |
| 6,326,316 B1 | * | 12/2001 | Kiyotoshi et al. | 438/763 |
| 6,544,857 B1 | * | 4/2003 | Hironaka et al. | 438/396 |
| 6,580,115 B2 | * | 6/2003 | Agarwal | 257/310 |
| 6,849,468 B2 | * | 2/2005 | Jang et al. | 438/3 |
| 6,900,517 B2 | * | 5/2005 | Tanaka et al. | 257/532 |
| 7,042,042 B2 | * | 5/2006 | Won et al. | 257/304 |
| 2001/0029053 A1 | * | 10/2001 | Jaing et al. | 438/3 |
| 2004/0025787 A1 | * | 2/2004 | Selbrede et al. | 118/715 |
| 2004/0248362 A1 | * | 12/2004 | Nakamura et al. | 438/241 |
| 2004/0262658 A1 | * | 12/2004 | Rasmussen | 257/300 |
| 2005/0224995 A1 | * | 10/2005 | Lee et al. | 257/915 |
| 2006/0073669 A1 | * | 4/2006 | Kim et al. | 438/387 |
| 2006/0263977 A1 | * | 11/2006 | Kim et al. | 438/253 |
| 2007/0269955 A2 | * | 11/2007 | Yamamoto | 438/396 |

FOREIGN PATENT DOCUMENTS

JP 2002-222934 8/2002

* cited by examiner

*Primary Examiner*—Phuc T Dang
(74) *Attorney, Agent, or Firm*—McDermott Will & Emery LLP (57) ABSTRACT

A semiconductor device includes a capacitor formed by successively stacking a lower electrode, a capacitor dielectric film and an upper electrode on a substrate. The lower electrode includes a first conducting layer and a second conducting layer formed on the first conducting layer and having higher resistivity than the first conducting layer, and the capacitor dielectric film is formed so as to be in contact with the second conducting layer of the lower electrode.

43 Claims, 7 Drawing Sheets

SEMICONDUCTOR DEVICE AND METHOD FOR FABRICATING THE SAME

BACKGROUND OF THE INVENTION

The present invention relates to a semiconductor device, and more particularly, it relates to a semiconductor device including a capacitor and a method for fabricating the same.

Recently, in accordance with the increased degree of integration, the improved performance and the increased speed of semiconductor integrated circuit devices, a technique to use an MIM (metal-insulator-metal) capacitor having a capacitor dielectric film made of a high dielectric constant film in a semiconductor device such as a DRAM (dynamic random access memory) has been proposed.

In order to increase the refinement and the density of a semiconductor device, it is indispensable to reduce the area occupied by a capacitor in a chip. In order to make a memory stably operate, however, a given or larger capacitance value is necessary. Therefore, by using a high dielectric constant film of a Hf oxide ($HfO_x$) or a Zr oxide ($ZrO_x$) as a capacitor dielectric film, a sufficient capacitance value is to be secured while reducing the area occupied by the capacitor.

In the conventional high dielectric constant film of $HfO_x$ or $ZrO_x$, however, a state attained immediately after deposition is a polycrystalline state because of the influence of an underlying film, and a grain boundary is present in such a high dielectric constant film. Accordingly, when the semiconductor device is activated and a voltage is applied to the capacitor, a leakage current passes through the grain boundary present in the capacitor dielectric film, so as to disadvantageously easily cause dielectric breakdown of the capacitor dielectric film.

As countermeasure, a technique to suppress the leakage current in the MIM capacitor by depositing Al oxide ($AlO_x$) on a lower electrode and forming a high dielectric constant film (of, for example, $HfO_x$) thereon has been proposed (see Patent Document 1 below).

A method for fabricating a conventional MIM capacitor using a multilayered film composed of an $AlO_x$ film and a $HfO_x$ film as a capacitor dielectric film will now be described.

FIGS. 7A through 7F are cross-sectional views for showing procedures in the method for fabricating a conventional MIM capacitor.

Figure 7A:
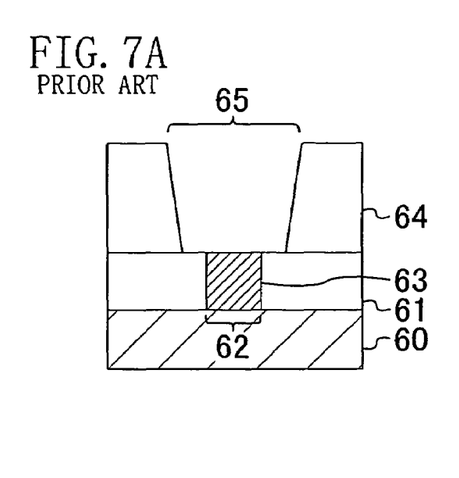
FIGS. 7A, 7B, 7C, 7D, 7E and 7F are cross-sectional views for showing procedures in a method for fabricating a conventional MIM capacitor.

First, in the procedure shown in FIG. 7A, after depositing a first interlayer insulating film 61 on a silicon substrate 60, a first hole 62 penetrating the first interlayer insulating film 61 is formed. Then, after forming a conducting plug 63 in the first hole 62, a second interlayer insulating film 64 is deposited on the first interlayer insulating film 61 and on the conducting plug 63. Thereafter, a second hole 65 penetrating the second interlayer insulating film 64 and reaching the conducting plug 63 is formed.

Figure 7B:
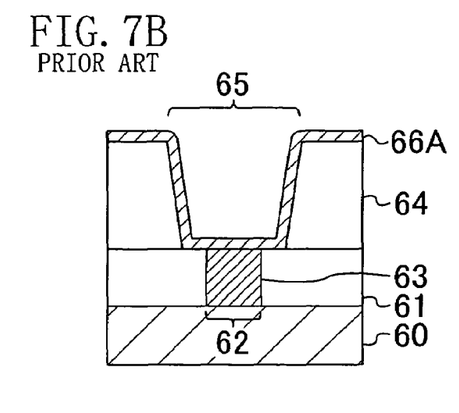

Next, in the procedure shown in FIG. 7B, a lower electrode material film 66A is deposited over the bottom and the inner wall of the second hole 65 so as to also cover a portion of the second interlayer insulating film 64 disposed outside the second hole 65.

Figure 7C:
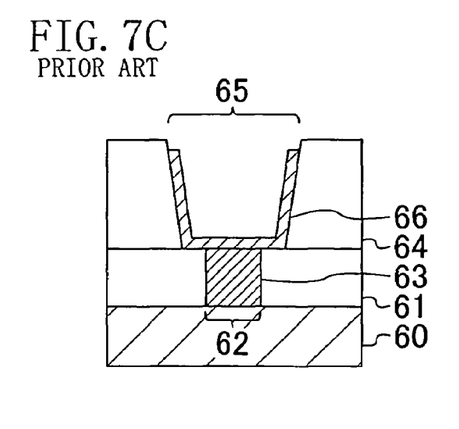

Then, in the procedure shown in FIG. 7C, a portion of the lower electrode material film 66A deposited on the portion of the second interlayer insulating film 64 disposed outside the second hole 65 is removed. Thus, a lower electrode 66 with a three-dimensional structure is formed in the second hole 65.

Figure 7D:
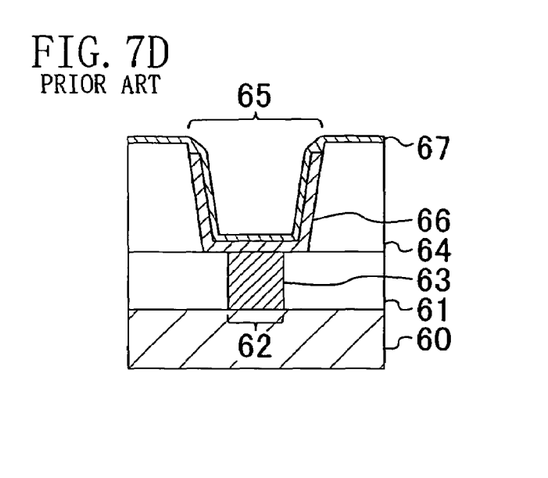

Next, in the procedure shown in FIG. 7D, an $AlO_x$ film 67 is deposited on the lower electrode 66 by ALD (atomic layer deposition).

Figure 8:
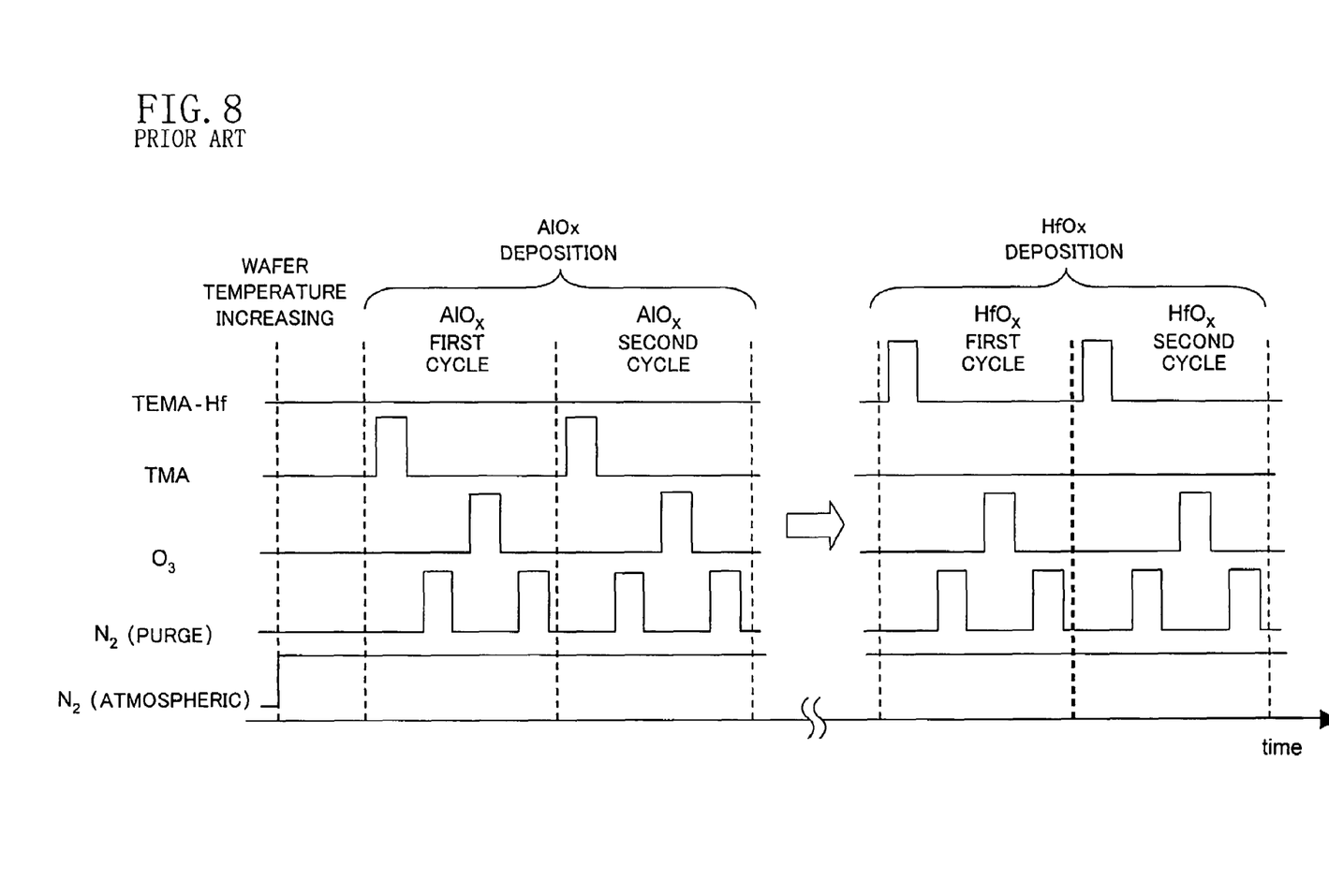
FIG. 8 is a diagram for showing a sequence for introducing reaction gases in deposition of an $AlO_x$ film by the ALD and in deposition of a $HfO_x$ film by the ALD in the method for fabricating a conventional MIM capacitor.

FIG. 8 shows a sequence for introducing reaction gases in the deposition of the $AlO_x$ film by the ALD and deposition of a $HfO_x$ film by the ALD described below.

As shown in FIG. 8, an atmospheric gas ($N_2$) is first introduced into a chamber, and the temperature of the silicon substrate (wafer) 60 is increased. Then, a TMA (trimethyl aluminum) gas corresponding to an Al supply source is introduced into the chamber in pulsed form, so as to allow the TMA or its active species to be chemically adsorbed onto the surfaces of the second interlayer insulating film 64 and the lower electrode 66. Next, with the TMA gas stopped, a purge gas ($N_2$) is introduced into the chamber in pulsed form, so as to remove the TMA gas remaining in the chamber. Then, after stopping the purge gas, an ozone ($O_3$) gas is introduced into the chamber in pulsed form. At this point, the ozone gas is thermally reacted with the TMA or the active species adsorbed to the surfaces of the second interlayer insulating film 64 and the lower electrode 66, so as to produce $AlO_x$ corresponding to one atomic layer. Thereafter, the purge gas is introduced into the chamber in pulsed form again so as to remove the ozone gas remaining in the chamber. When such a sequence for depositing $AlO_x$ corresponding to one atomic layer is repeated a plurality of times, the $AlO_x$ film 67 with a desired thickness can be formed on the second interlayer insulating film 64 and the lower electrode 66.

Figure 7E:
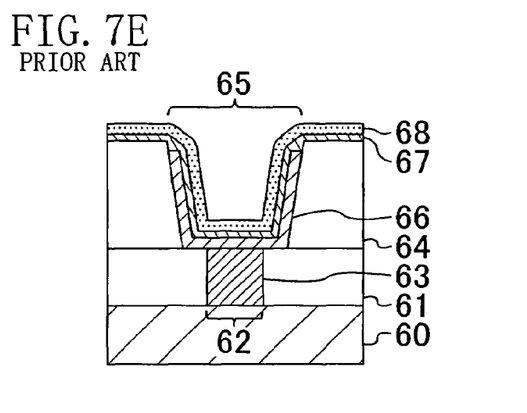

Next, in the procedure shown in FIG. 7E, a $HfO_x$ film 68 to be used as a capacitor dielectric film is deposited on the $AlO_x$ film 67 by the ALD.

Specifically, as shown in FIG. 8, a TEMA-Hf (tetraethylmethylamino hafnium) gas corresponding to a Hf supply source is introduced into the chamber in pulsed form, so as to allow the TEMA-Hf or its active species to be chemically adhered onto the surface of the $AlO_x$ film 67. Then, after the TEMA-Hf gas is stopped, the purge gas is introduced into the chamber in pulsed form, so as to remove the TEMA-Hf gas remaining in the chamber. Next, the purge gas is stopped, and an ozone gas is introduced into the chamber in pulsed form. At this point, the ozone gas is thermally reacted with the TEMA-Hf or the active species adhered to the surface of the $AlO_x$ film 67, so as to produce $HfO_x$ corresponding to one atomic layer. Thereafter, the purge gas is introduced into the chamber in pulsed form again, so as to remove the ozone gas remaining in the chamber. When such a sequence for depositing $HfO_x$ corresponding to one atomic layer is repeated a plurality of times, the $HfO_x$ film 68 with a desired thickness can be formed on the $AlO_x$ film 67.

Figure 7F:
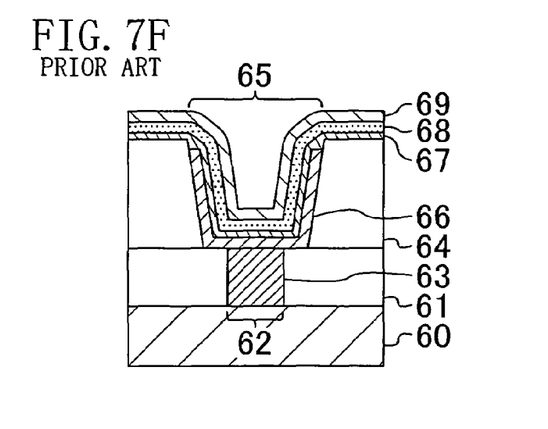

Next, in the procedure shown in FIG. 7F, after depositing an upper electrode material film 69 of titanium nitride or the like on the $HfO_x$ film 68, the upper electrode material film 69 is formed into an upper electrode with a desired shape.

Through the aforementioned procedures, an MIM capacitor having a capacitor dielectric film made of a multilayered film of the $AlO_x$ film 67 and the $HfO_x$ film 68 on the silicon substrate 60 is fabricated.

Patent Document 1: Japanese Laid-Open Patent Publication No. 2002-222934

SUMMARY OF THE INVENTION

When the area occupied by a capacitor is further reduced in the future, it is necessary to reduce the thickness of a capacitor dielectric film for securing a capacitance value. However, in the conventional MIM capacitor having the capacitor dielectric film made of the multilayered film of an $AlO_x$ film and a $HfO_x$ film with a lower dielectric constant than $HfO_x$ or $ZrO_x$, it is difficult to secure a desired capacitance value by reducing the thickness of the capacitor dielectric film.

For example, $Al_2O_3$ has a dielectric constant of approximately 9 and $HfO_2$ has a dielectric constant of approximately 20, and hence, the capacitor dielectric film made of the multilayered film of the $AlO_x$ film and the $HfO_x$ film has a practical dielectric constant of approximately 12 through 16. Therefore, in the capacitor dielectric film made of the multilayered film of the $AlO_x$ film and the $HfO_x$ film, in order to secure a capacitance value equivalent to that attained by a single $HfO_x$ film, the thickness of the multilayered film of the $AlO_x$ film and the $HfO_x$ film should be not larger than ¾ of the thickness of a single $HfO_x$ film.

In the case where the thickness of the multilayered film of the $AlO_x$ film and the $HfO_x$ film is reduced, however, when Teq (thickness equivalent, i.e., a thickness converted as an oxide film) is approximately 1.2 nm, there arises a problem that a leakage current is increased in the MIM capacitor due to the tunnel effect. Therefore, in the conventional MIM capacitor using the capacitor dielectric film made of the multilayered film of the $AlO_x$ film and the $HfO_x$ film, it is very difficult to secure a capacitance value corresponding to Teq of 1.2 nm or less.

In consideration of this conventional problem, an object of the invention is providing a semiconductor device including an MIM capacitor in which a leakage current can be suppressed and a high dielectric constant can be kept and a method for fabricating the same.

In order to achieve the object, the present inventors have examined the reason why a leakage current is increased in the conventional MIM capacitor when the Teq is approximately 1.2 nm, resulting in finding the following:

In the method for fabricating the conventional MIM capacitor, an upper portion of the lower electrode in contact with the capacitor dielectric film is subjected to plasma processing. In this case, in part of a plurality of (approximately several ten thousand) capacitors, the lower electrode is partially crystallized, and hence, the capacitor dielectric film formed on the partially crystallized lower electrode is also partially crystallized, resulting in increasing a leakage current. In other words, in most of the conventional capacitors, the upper portions of the lower electrodes are crystalline.

Therefore, the present inventors have reached the following conception: In the formation of a lower electrode, an upper portion of the lower electrode in contact with a capacitor dielectric film is not subjected to the plasma processing, so as to keep the upper portion of the lower electrode amorphous. Thus, in the formation of a capacitor dielectric film, the capacitor dielectric film can be prevented from succeeding to the crystallinity of the underlying film. Since the capacitor dielectric film can keep its amorphous state in this manner, the leakage current derived from the crystallization of the capacitor dielectric film can be reduced.

When an electrode material is kept in an amorphous state, the resistivity becomes higher than in the case where at least part of the electrode material is crystallized. Accordingly, in the case where the upper portion of the lower electrode is kept in the amorphous state, in order to prevent the resistivity of the whole lower electrode from increasing, a portion of the lower electrode other than the upper portion is preferably crystallized at least partially, namely, the resistivity of the portion of the lower electrode other than the upper portion is preferably lower than the resistivity of the upper portion of the lower electrode.

The present invention was devised on the basis of the aforementioned finding, and specifically, the semiconductor device of this invention includes a capacitor formed by successively stacking a lower electrode, a capacitor dielectric film and an upper electrode on a substrate, and the lower electrode includes a first conducting layer and a second conducting layer formed on the first conducting layer and having higher resistivity than the first conducting layer, and the capacitor dielectric film is formed in contact with the second conducting layer of the lower electrode.

In the semiconductor device of the invention, the capacitor dielectric film is preferably made of an insulating metal oxide, such as a Hf oxide or a Zr oxide.

In the semiconductor device of the invention, the capacitor dielectric film is preferably amorphous.

In the semiconductor device of the invention, the second conducting layer of the lower electrode is preferably made of at least one of a metal, a metal oxide and a metal nitride.

In the semiconductor device of the invention, the second conducting layer of the lower electrode is preferably amorphous.

In the semiconductor device of the invention, the second conducting layer of the lower electrode is preferably a conducting film that is formed by MOCVD and has not been subjected to plasma processing for reducing resistance thereof.

In the semiconductor device of the invention, the first conducting layer of the lower electrode is preferably a conducting film that is formed by MOCVD and has been subjected to plasma processing for reducing resistance thereof.

In the semiconductor device of the invention, the first conducting layer of the lower electrode is preferably a conducting film formed by ALD.

In the semiconductor device of the invention, the first conducting layer and the second conducting layer of the lower electrode may be titanium nitride films.

In the semiconductor device of the invention, the first conducting layer and the second conducting layer of the lower electrode may be tantalum nitride films.

The method of this invention for fabricating a semiconductor device including a capacitor formed by successively stacking a lower electrode, a capacitor dielectric film and an upper electrode on a substrate, includes the steps of (a) forming, on the substrate, a first conducting layer corresponding to a part of the lower electrode; (b) forming, on the first conducting layer, a second conducting layer corresponding to another part of the lower electrode and having resistivity lower than the first conducting layer; and (c) forming the capacitor dielectric film on the second conducting layer so as to be in contact with the second conducting layer.

In the method for fabricating a semiconductor device of this invention, the first conducting layer is preferably subjected to a treatment using plasma including a hydrogen ion and a nitrogen ion for reducing resistance of the first conducting layer after forming the first conducting layer by MOCVD in the step (a), and the second conducting layer is preferably not subjected to the treatment using the plasma after forming the second conducting layer by the MOCVD in step (b).

In the method for fabricating a semiconductor device of this invention, the first conducting layer is preferably formed by ALD in the step (a), and the second conducting layer is preferably formed by CVD in the step (b).

In the method for fabricating a semiconductor device of the invention, the capacitor dielectric film is preferably made of an insulating metal oxide.

In the method for fabricating a semiconductor device of this invention, the capacitor dielectric film is preferably amorphous.

In the method for fabricating a semiconductor device of the invention, the second conducting layer of the lower electrode is preferably made of one of a metal, a metal oxide and a metal nitride.

In the method for fabricating a semiconductor device of the invention, the second conducting layer of the lower electrode is preferably amorphous.

According to the present invention, since the second conducting layer of the lower electrode in contact with the capacitor dielectric film is amorphous, the capacitor dielectric film formed on the second conducting layer does not grow as crystal but is formed as amorphous. Therefore, a leakage current derived from crystallization of the capacitor dielectric film can be suppressed. Also, since the crystallization of the capacitor dielectric film can be prevented, the capacitor dielectric film can be made of merely a high dielectric constant film with a high dielectric constant. Therefore, the physical thickness of the capacitor dielectric film can be kept to some extent while securing a capacitance value, and hence, a leakage current derived from the tunnel effect can be suppressed.

In this manner, the present invention is useful for a semiconductor device including an MIM capacitor having a capacitor dielectric film made of a high dielectric constant film and a method for fabricating the same.

DETAILED DESCRIPTION OF THE INVENTION

Embodiment 1

A method for fabricating a semiconductor device according to Embodiment 1 of the invention will now be described with reference to the accompanying drawings.

FIGS. 1A through 1F are cross-sectional views for showing procedures in the method for fabricating a semiconductor device of this embodiment.

Figure 1A:
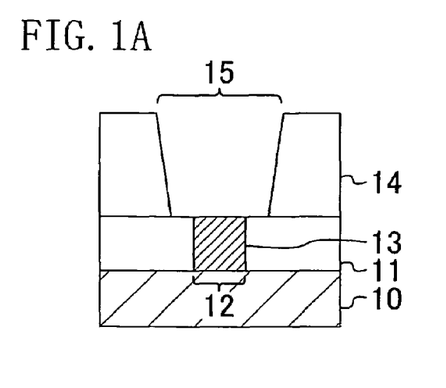
FIGS. 1A, 1B, 1C, 1D, 1E and 1F are cross-sectional views for showing procedures in a method for fabricating a semiconductor device according to Embodiment 1 of the invention.

First, in the procedure shown in FIG. 1A, a first interlayer insulating film 11 with a thickness of, for example, 300 nm is deposited on a semiconductor substrate 10 of, for example, silicon. Then, after forming a first hole 12 with a diameter of, for example, 150 nm so as to penetrate the first interlayer insulating film 11 and reach the semiconductor substrate 10, a conducting material such as tungsten, titanium or titanium nitride is filled in the first hole 12 so as to form a conducting plug 13. Thereafter, a second interlayer insulating film 14 with a thickness of, for example, 500 nm is deposited on the first interlayer insulating film 11, and a second hole 15 with a diameter of, for example, 400 nm is formed so as to penetrate the second interlayer insulating film 14 and reach the conducting plug 13.

Figure 1B:
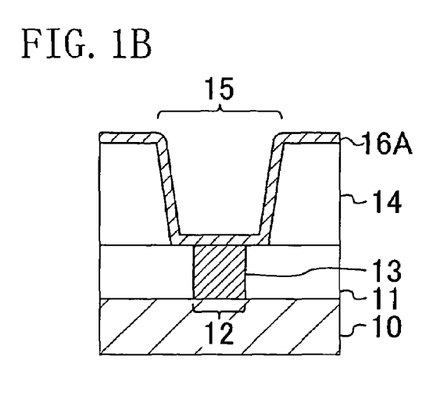

Next, in the procedure shown in FIG. 1B, a titanium nitride film 16A is deposited over the bottom and the inner wall of the second hole 15 so as to also cover a portion of the second interlayer insulating film 14 disposed outside the second hole 15. At this point, the titanium nitride film 16A is formed by, for example, MOCVD (metal organic chemical vapor deposition).

Now, a sequence for depositing the titanium nitride film 16A and a titanium nitride film 16B (a lower electrode uppermost portion) described below by the MOCVD will be described in detail with reference to FIG. 2.

Figure 2:
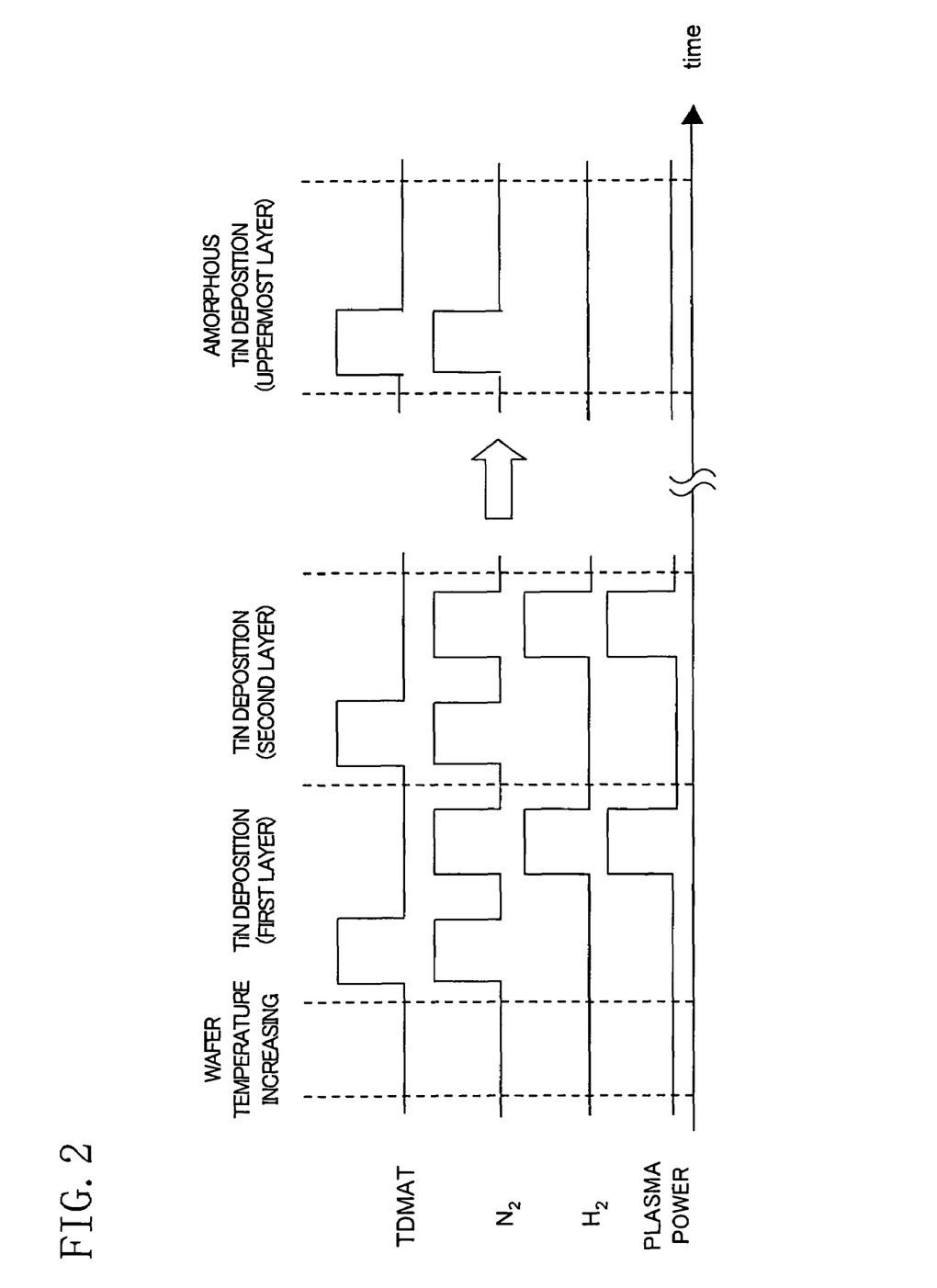
FIG. 2 is a diagram for showing a sequence for introducing reaction gases in deposition of a TiN film by MOCVD in the method for fabricating a semiconductor device of Embodiment 1.

As shown in FIG. 2, after inserting the semiconductor substrate 10 into a chamber, the temperature of the semiconductor substrate 10 is increased to, for example, 350 through 400° C. At this point, the gas pressure within the chamber is set to, for example, approximately 50 through 300 Pa. Next, a TDMAT (tetradimethylamino titanium) gas corresponding to a TiN (titanium nitride) material gas and a nitrogen ($N_2$) gas are simultaneously introduced into the chamber in pulsed form. Thus, the TDMAT is thermally decomposed on the semiconductor substrate 10, so that a titanium nitride film with a thickness of, for example, 5 nm can be deposited over the bottom and the inner wall of the second hole 15 so as to also cover the portion of the second interlayer insulating film 14 disposed outside the second hole 15. At this point, the titanium nitride film deposited through the thermal decomposition of the TDMAT includes a large quantity of carbon (C) that is a composing element of the TDMAT and is not detached from the semiconductor substrate 10, and therefore, this film includes a large number of portions where Ti and N are not bonded to each other. Accordingly, the titanium nitride film formed through the thermal decomposition of the TDMAT alone has resistivity as high as approximately 700 μΩ·cm and is an amorphous film. In order to use such an amorphous and high-resistant titanium nitride film as a lower electrode of a rapid DRAM, it is necessary to reduce the resistance of the titanium nitride film.

Therefore, in this embodiment, the titanium nitride film deposited through the thermal decomposition of the TDMAT is subjected to plasma processing for reducing the resistance. Specifically, after forming the titanium nitride film, the TDMAT gas and the nitrogen gas are stopped and the TDMAT gas remaining in the chamber is removed as shown in FIG. 2. Thereafter, a hydrogen ($H_2$) gas and a nitrogen ($N_2$) gas are simultaneously introduced into the chamber in pulsed form and the power of a plasma generator is increased, so as to generate mixed plasma of hydrogen and nitrogen within the chamber. When the semiconductor substrate 10 is exposed to the mixed plasma, a hydrogen ion included in the plasma and carbon (C) included in the titanium nitride film are bonded to each other so as to produce an organic product. When the organic product is released from the titanium nitride film, carbon (C) is removed from the titanium nitride film. Furthermore, a nitrogen ion included in the plasma and Ti included in the titanium nitride film are bonded to each other, so as to crystallize a part of the titanium nitride film. As a result, the resistivity of the titanium nitride film is reduced to approximately 200 μΩ·cm.

Through the series of processing of "exposing a titanium nitride film to mixed plasma of hydrogen and nitrogen after depositing the titanium nitride film through thermal decomposition of TDMAT", a titanium nitride film partially crystallized is formed in a thickness of approximately 5 nm. In this embodiment, this series of processing is performed twice more, so as to form the titanium nitride film 16A in a thickness of approximately 15 nm. In other words, the titanium nitride film 16A includes three layers of titanium nitride films each having a thickness of 5 nm, and the respective layers of the titanium nitride films are subjected to the plasma processing so as to reduce their resistivity. Thus, the titanium nitride film 16A is partially crystallized through the plasma processing.

Figure 1C:
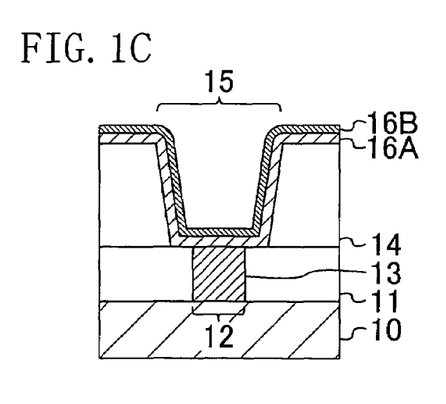

Next, in the procedure shown in FIG. 1C, the titanium nitride film 16B is deposited by, for example, the MOCVD on the titanium nitride film 16A having been subjected to the plasma processing. The sequence for depositing the titanium nitride film 16B (the lower electrode uppermost portion) is shown in FIG. 2. Specifically, a TDMAT gas and a nitrogen gas are simultaneously introduced into the chamber in pulsed form, so as to deposit an amorphous titanium nitride film 16B with a thickness of approximately 5 nm through the thermal decomposition of the TDMAT. Thereafter, the TDMAT gas and the nitrogen gas are stopped, and the TDMAT gas remaining in the chamber is removed. In this case, differently from the titanium nitride film 16A, the amorphous titanium nitride film 16B is not subjected to the plasma processing for reducing the resistivity but the titanium nitride film 16B is kept in the amorphous state. As described above, an amorphous titanium nitride film has resistivity as high as approximately 700 μΩ·cm and hence cannot be used as a lower electrode. However, in this embodiment, the whole lower electrode is not made of merely the amorphous titanium nitride film with resistivity as high as 700 μΩ·cm but a multilayered structure (having resistivity as low as approximately 250 μΩ·cm) of the titanium nitride film 16A having resistivity reduced through the plasma processing and the amorphous titanium nitride film 16B is used as the lower electrode as shown in FIG. 1C, and hence, there arises no problem of high resistivity.

Figure 1D:
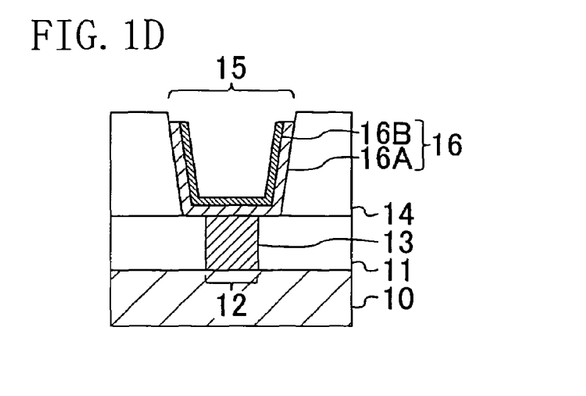

Next, in the procedure shown in FIG. 1D, the second hole 15 in which the titanium nitride film 16B is formed is covered with a resist (not shown) so as to protect the titanium nitride films 16A and 16B formed within the second hole 15. Subsequently, the whole surface of the substrate is etched back with the resist used as a mask, so as to remove the portions of the titanium nitride films 16A and 16B disposed on the second interlayer insulating film 14 outside the second hole 15. Thus, a lower electrode 16 made of the multilayered film of the titanium nitride film 16A having resistivity reduced through the plasma processing and the amorphous titanium nitride film 16B not subjected to the plasma processing is formed in the second hole 15. Although the resistivity of the titanium nitride film 16B is higher than that of the titanium nitride film 16A, the resistivity of the whole lower electrode 16 can be reduced owing to the multilayered structure including the titanium nitride film 16B and the titanium nitride film 16A.

Figure 1E:
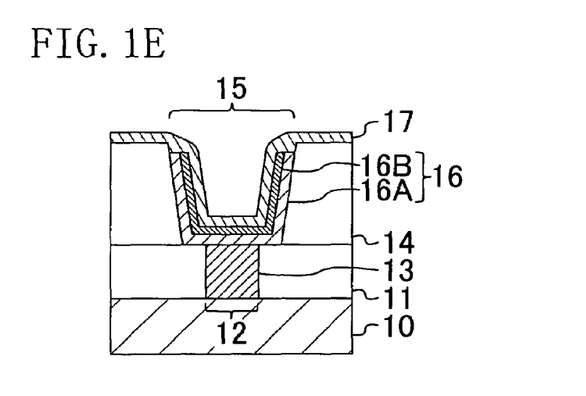

Then, in the procedure shown in FIG. 1E, a capacitor dielectric film 17 made of a $HfO_x$ film is deposited on the lower electrode 16 and the second interlayer insulating film 14. This capacitor dielectric film 17 is formed by atomic layer deposition (ALD).

Figure 3:
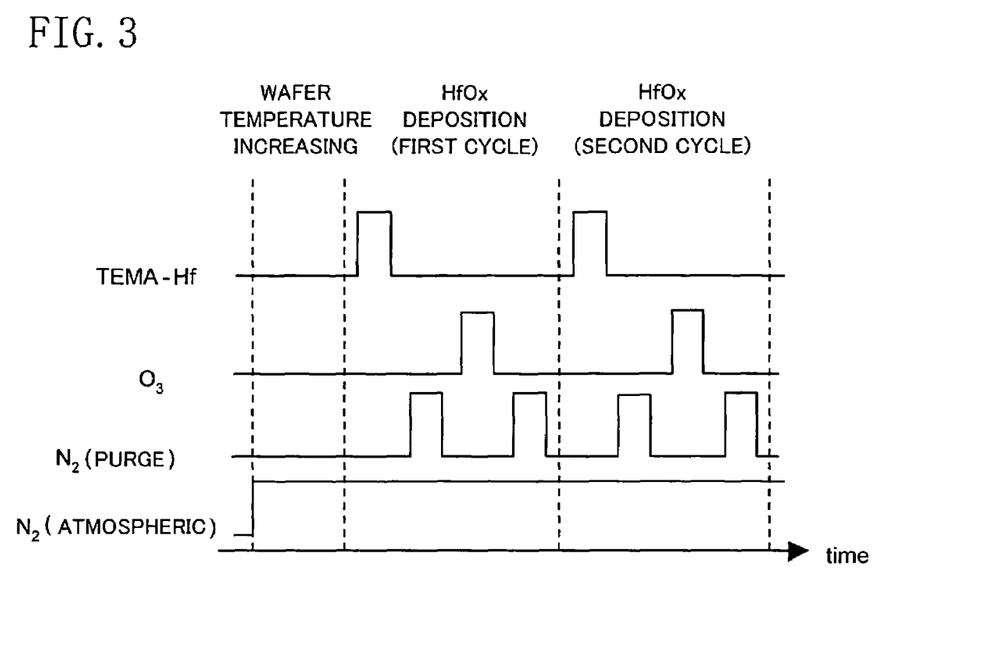
FIG. 3 is a diagram for showing a sequence for introducing reaction gases in deposition of a $HfO_x$ film by ALD in the method for fabricating a semiconductor device of Embodiment 1.

FIG. 3 shows a sequence for introducing reaction gases in the deposition of the $HfO_x$ film by the ALD in this embodiment.

Specifically, as shown in FIG. 3, an atmospheric gas (such as a nitrogen ($N_2$) gas) is first introduced into a chamber, and the temperature of the semiconductor substrate 10 is increased to, for example, 200 through 400° C. At this point, the gas pressure within the chamber is set to, for example, approximately 100 Pa. As the atmospheric gas, an inert gas such as argon may be used instead of the nitrogen gas. Next, a TEMA-Hf (tetraethylmethylamino hafnium) gas corresponding to a Hf supply source is introduced into the chamber in pulsed form, so as to allow the TEMA-Hf or its active species to be chemically adsorbed onto the surfaces of the second interlayer insulating film 14 and the lower electrode 16. Next, after stopping the TEMA-Hf gas, a purge gas is introduced into the chamber in pulsed form, so as to remove the TEMA-Hf gas remaining in the chamber. At this point, as the purge gas, for example, a nitrogen gas, an argon gas, a helium gas or the like may be used. Then, after stopping the purge gas, an ozone ($O_3$) gas is introduced into the chamber in pulsed form. Thus, the ozone gas is thermally reacted with the TEMA-Hf or its active species adhered to the second interlayer insulating film 14 and the lower electrode 16, so as to produce $HfO_x$ corresponding to one atomic layer. Thereafter, the purge gas is introduced into the chamber in pulsed form again, so as to remove the ozone gas remaining in the chamber. In this embodiment, such a sequence for depositing a $HfO_x$ film is repeated, for example, forty times, so that the capacitor dielectric film 17 made of an amorphous $HfO_x$ film with a thickness of approximately 6 nm can be formed. Then, the capacitor dielectric film 17 is subjected to plasma oxidation, so as to stabilize the film quality by supplying oxygen to an oxygen defective portion within the capacitor dielectric film 17.

Figure 1F:
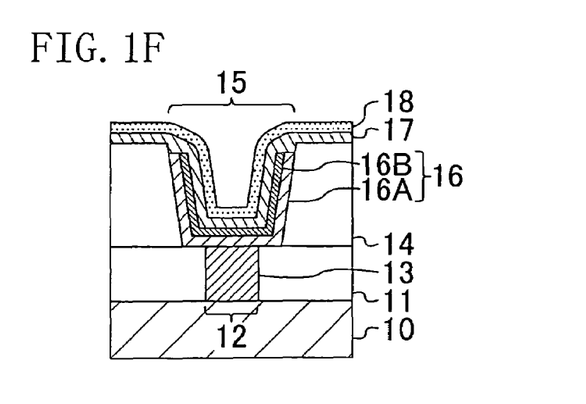

Next, in the procedure shown in FIG. 1F, an upper electrode material film 18 of, for example, a titanium nitride film or the like with a thickness of approximately 50 nm is formed on the capacitor dielectric film 17. Thereafter, although not shown in the drawings, the upper electrode material film 18 is processed into a desired shape so as to be formed into an upper electrode.

Through the aforementioned procedures, an MIM capacitor of this embodiment composed of the lower electrode 16 made of the multilayered film of the titanium nitride film 16A having resistivity reduced through the plasma processing and the amorphous titanium nitride film 16B not subjected to the plasma processing; the amorphous capacitor dielectric film 17 formed on the lower electrode 16; and the upper electrode formed on the capacitor dielectric film 17 can be formed on the semiconductor substrate 10.

Figure 4:
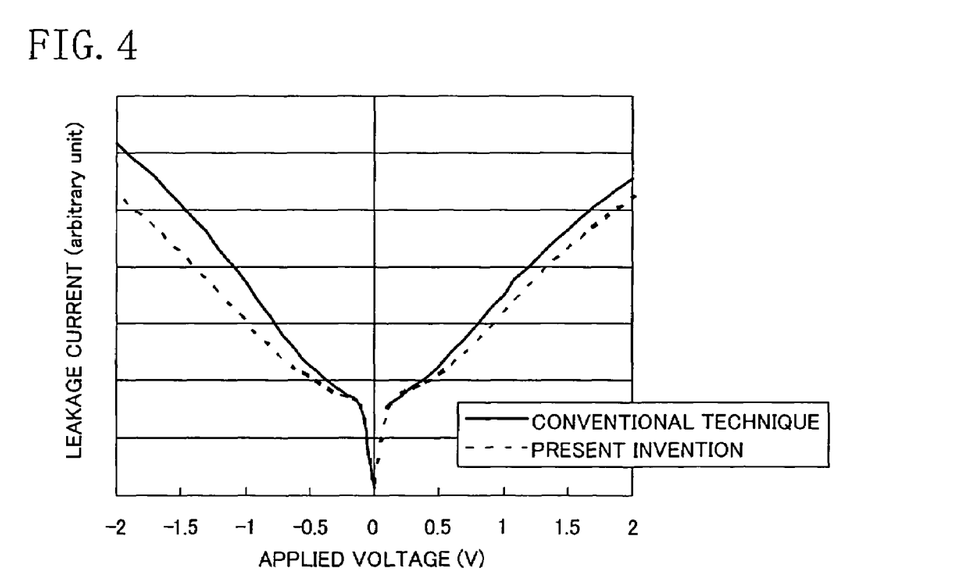
FIG. 4 is an I-V characteristic diagram for showing the correlation between an applied voltage and a leakage current in an MIM capacitor of the invention and a conventional MIM capacitor.

FIG. 4 shows the I-V characteristic of the MIM capacitor of this embodiment. In FIG. 4, a broken line indicates the I-V characteristic of the MIM capacitor of this embodiment, a solid line indicates the I-V characteristic of a conventional MIM capacitor, the abscissa indicates the applied voltage and the ordinate indicates the leakage current occurring in the capacitor. As shown in FIG. 4, the leakage current can be smaller in the MIM capacitor of this embodiment than in the conventional MIM capacitor. The reason will now be described.

As described above, the MIM capacitor of this embodiment is composed of the lower electrode made of the multilayered film of the titanium nitride film having resistivity reduced through the plasma processing and the amorphous titanium nitride film not subjected to the plasma processing; the capacitor dielectric film made of the $HfO_x$ film with a thickness of approximately 6 nm formed on the lower electrode; and the upper electrode formed on the capacitor dielectric film.

On the other hand, the conventional MIM capacitor is composed of a lower electrode made of a titanium nitride film that has resistance reduced and is partially crystallized through the plasma processing; a capacitor dielectric film made of a HfO$_x$ film with a thickness of approximately 6 nm formed on the lower electrode; and an upper electrode formed on the capacitor dielectric film. Furthermore, in the conventional MIM capacitor, HfO$_x$ is directly deposited on the lower electrode made of the titanium nitride film having been subjected to the plasma processing. In this case, the titanium nitride film used as the lower electrode is partially crystallized through the plasma processing. Therefore, the HfO$_x$ directly deposited on the partially crystallized titanium nitride film grows as crystal while succeeding to the crystallinity of the underlying titanium nitride film, and hence, the HfO$_x$ film is partially polycrystallized. In this manner, since the HfO$_x$ film used as the capacitor dielectric film is partially polycrystallized in the conventional MIM capacitor, the leakage current is increased.

On the contrary, in the MIM capacitor of this embodiment, the upper portion of the lower electrode in contact with the capacitor dielectric film is made of the amorphous titanium nitride film not subjected to the plasma processing, and the HfO$_x$ film used as the capacitor dielectric film is formed on this titanium nitride film in the amorphous state. Therefore, the HfO$_x$ film formed on the amorphous titanium nitride film does not grow as crystal but is formed as an amorphous film because the underlying titanium nitride film is amorphous. In this manner, since the HfO$_x$ film used as the capacitor dielectric film is formed definitely as an amorphous film in the MIM capacitor of this embodiment, the leakage current derived from the crystallization of the capacitor dielectric film can be suppressed. As a result, the leakage current is smaller in the present MIM capacitor than in the conventional MIM capacitor.

As described so far, according to this embodiment, the amorphous titanium nitride film 16B is formed as the upper portion of the lower electrode 16 and the HfO$_x$ film is formed on the amorphous titanium nitride film 16B by, for example, the ALD, the capacitor dielectric film 17 made of the amorphous HfO$_x$ film can be formed without succeeding to the crystallinity of the underlying film. Accordingly, the capacitor dielectric film 17 can attain a high dielectric constant and the leakage current passing a grain boundary can be suppressed in the MIM capacitor. Also, since the crystallization of the capacitor dielectric film 17 can be prevented, the capacitor dielectric film 17 can be made of merely the HfO$_x$ film, that is, a high dielectric constant film with a high dielectric constant, the physical thickness of the capacitor dielectric film 17 can be kept to some extent while securing the capacitance value. As a result, a leakage current derived from the tunnel effect can be suppressed.

Embodiment 2

A method for fabricating a semiconductor device according to Embodiment 2 of the invention will now be described with reference to the accompanying drawings. Embodiment 2 is different from Embodiment 1 in a lower electrode made of a TaN film formed by the ALD.

FIGS. 5A through 5F are cross-sectional views for showing procedures in the method for fabricating a semiconductor device of this embodiment.

Figure 5A:
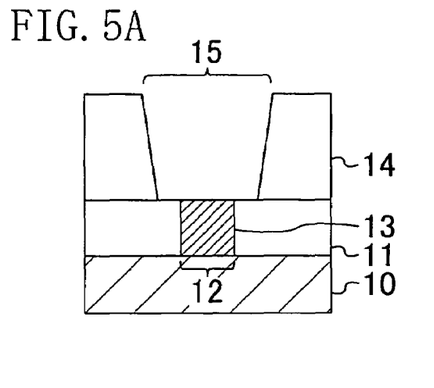
FIGS. 5A, 5B, 5C, 5D, 5E and 5F are cross-sectional views for showing procedures in a method for fabricating a semiconductor device according to Embodiment 2 of the invention.

First, in the procedure shown in FIG. 5A, a first interlayer insulating film 11 with a thickness of, for example, 300 nm is deposited on a semiconductor substrate 10 of silicon. Then, after forming a first hole 12 with a diameter of, for example, 150 nm so as to penetrate the first interlayer insulating film 11 and reach the semiconductor substrate 10, a conducting material such as tungsten, titanium or titanium nitride is filled in the first hole 12, so as to form a conducting plug 13. Thereafter, a second interlayer insulating film 14 with a thickness of, for example, 500 nm is deposited on the first interlayer insulating film 11, and a second hole 15 with a diameter of, for example, 400 nm is formed so as to penetrate the second interlayer insulating film 14 and reach the conducting plug 13.

Figure 5B:
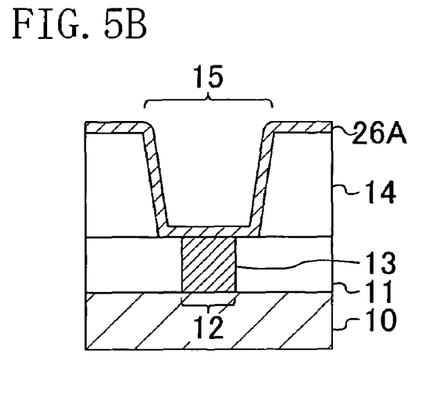

Next, in the procedure shown in FIG. 5B, a tantalum nitride film 26A is deposited over the bottom and the inner wall of the second hole 15 so as to also cover a portion of the second interlayer insulating film 14 disposed outside the second hole 15. At this point, the tantalum nitride film 26A is formed by the ALD with reaction gases intermittently supplied in pulsed form into, for example, a chamber (reaction chamber).

Figure 6:
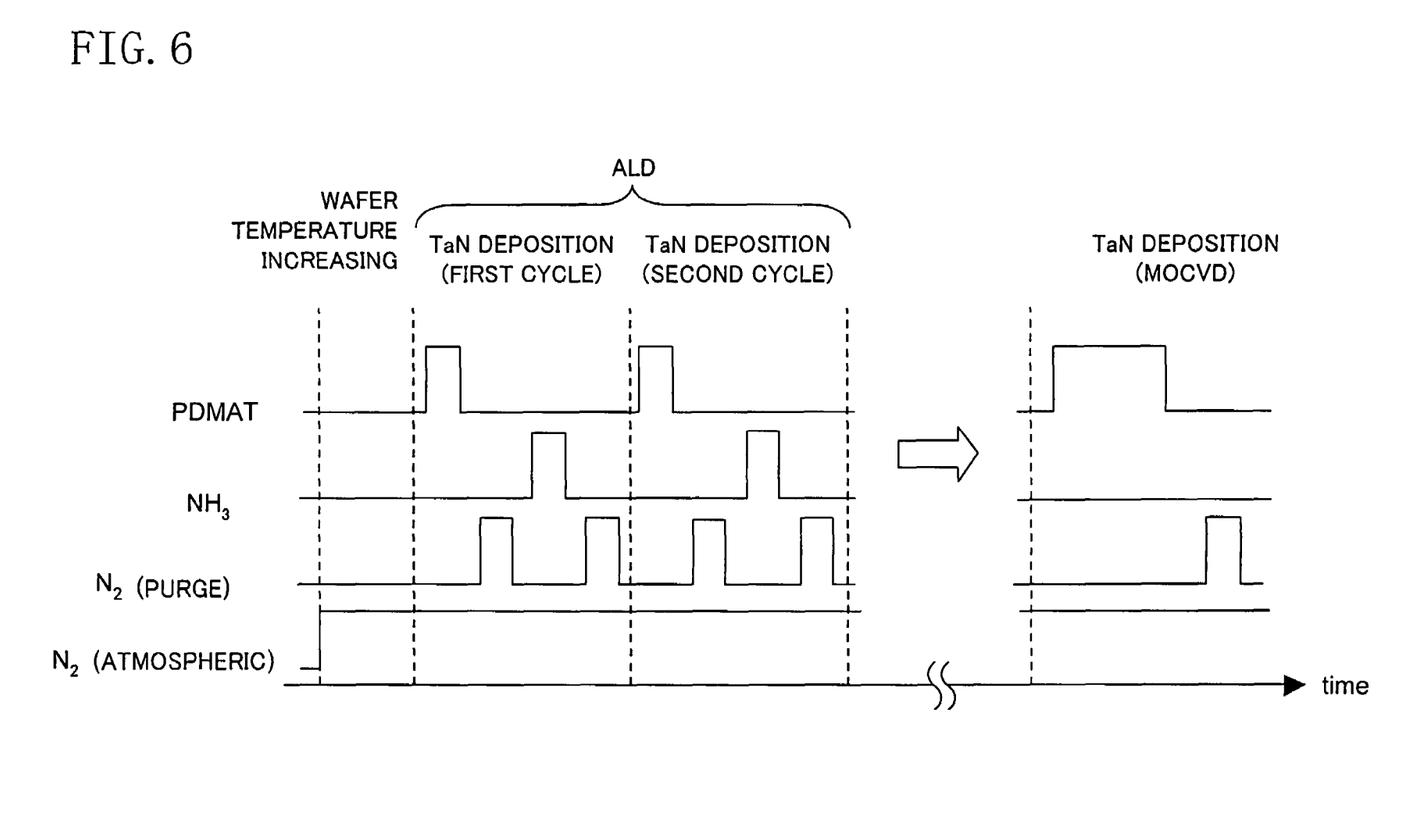
FIG. 6 is a diagram for showing a sequence for introducing reaction gases in deposition of a TaN film by the ALD and in deposition of a TaN film by the MOCVD in the method for fabricating a semiconductor device of Embodiment 2.

A sequence for depositing the tantalum nitride film 26A by the ALD will now be described in detail with reference to FIG. 6. FIG. 6 also shows a sequence for depositing a tantalum nitride film 26B by the MOCVD described below.

As shown in FIG. 6, an atmospheric gas (N$_2$) is first introduced into the chamber, the semiconductor substrate 10 is inserted into the chamber and the temperature of the semiconductor substrate 10 is increased to, for example, 300 through 400° C. At this point, the gas pressure within the chamber is set to, for example, approximately 50 through 300 Pa. Next, a PDMAT (pentadimethylamino tantalum) gas corresponding to a Ta (tantalum) material gas is introduced into the chamber in pulsed form. Thus, the PDMAT is thermally decomposed on the semiconductor substrate 10, so as to allow the PDMAT and its active species to be chemically adsorbed onto the bottom and the inner wall of the second hole 15 and onto the portion of the second interlayer insulating film 14 disposed outside the second hole 15. Next, after stopping the PDMAT gas, a purge gas is introduced into the chamber in pulsed form, so as to remove the PDMAT gas remaining in the chamber. At this point, as the purge gas, for example, a nitrogen gas, an argon gas, a helium gas or the like may be used. Then, after stopping the purge gas, an ammonia (NH$_3$) gas is introduced into the chamber in pulsed form. At this point, the NH$_3$ gas is thermally reacted with the PDMAT or its active species adhered to the bottom and the inner wall of the second hole 15 and the portion of the second interlayer insulating film 14, so as to produce TaN corresponding to one atomic layer. Thereafter, the purge gas is introduced into the chamber in pulsed form again, so as to remove the NH$_3$ gas remaining in the chamber. In this embodiment, such a sequence for depositing TaN is repeated, for example, eighty times, so as to form the tantalum nitride film 26A with a thickness of approximately 15 nm. In the above-described ALD, carbon (C) is efficiently removed from the tantalum nitride film in the thermal reaction between the NH$_3$ gas and the PDMAT or its active species. Therefore, the resistivity of the tantalum nitride film 26A thus formed by the ALD is as low as approximately 350 μΩ·cm, and therefore, the tantalum nitride film 26A can be directly used as a lower electrode without subjecting it to the plasma processing.

Figure 5C:
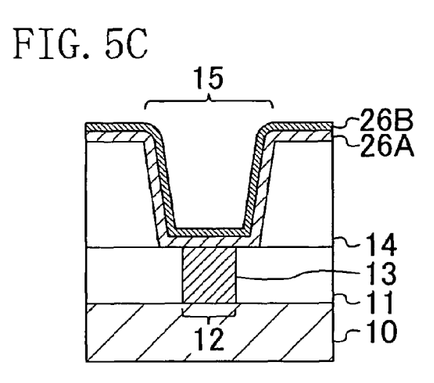

Next, in the procedure shown in FIG. 5C, the tantalum nitride film 26B is deposited by the MOCVD on the tantalum nitride film 26A formed by the ALD. The sequence for depositing this tantalum nitride film 26B is shown in FIG. 6. Specifically, a PDMAT gas is introduced into the chamber so as to deposit the amorphous tantalum nitride film 26B with a thickness of approximately 5 nm through the thermal decomposition of the PDMAT. At this point, the resistivity of the amorphous tantalum nitride film 26B is as high as 1000 μΩ·cm, and hence, this amorphous tantalum nitride film alone cannot be used as the lower electrode. In this embodiment, however, a multilayered structure (having resistivity as low as approximately 420 μΩ·cm) in which the amorphous tantalum nitride film 26B is formed on the tantalum nitride film 26A with low resistance formed by the ALD is used as the lower electrode as shown in FIG. 5C, and hence, there arises no problem of high resistivity.

Figure 5D:
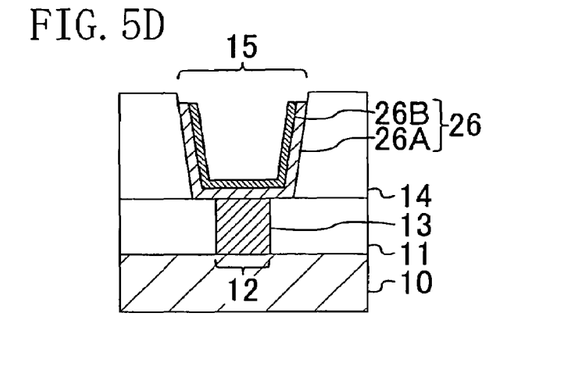

Then, in the procedure shown in FIG. 5D, the second hole 15 in which the tantalum nitride film 26B is formed is covered with a resist (not shown) so as to protect the tantalum nitride films 26A and 26B formed within the second hole 15. Subsequently, the whole surface of the substrate is etched back with the resist used as a mask, so as to remove the portions of the tantalum nitride films 26A and 26B disposed on the second interlayer insulating film 14 outside the second hole 15. Thus, a lower electrode 26 made of a multilayered film of the tantalum nitride film 26A formed by the ALD and the tantalum nitride film 26B formed by the MOCVD is formed in the second hole 15. Although the resistivity of the tantalum nitride film 26B in the amorphous state is higher than that of the tantalum nitride film 26A, the resistance of the whole lower electrode 26 can be reduced owing to the multilayered structure including the tantalum nitride film 26B and the tantalum nitride film 26A.

Figure 5E:
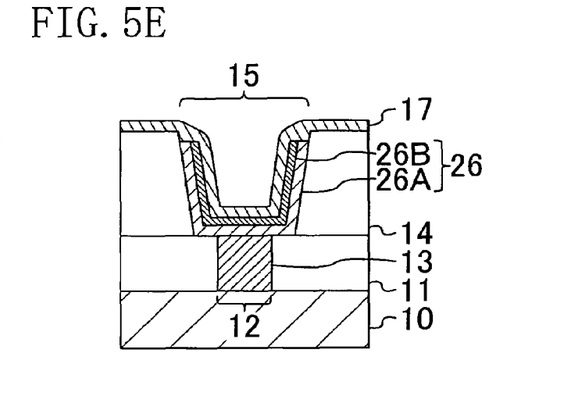

Then, in the procedure shown in FIG. 5E, a capacitor dielectric film 17 made of a $HfO_x$ film with a thickness of approximately 6 nm is deposited on the lower electrode 26 and the second interlayer insulating film 14 by the ALD in the same manner as in Embodiment 1 (the procedure shown in FIG. 1E). Thereafter, the capacitor dielectric film is subjected to the plasma oxidation, so as to stabilize the film quality by supplying oxygen to an oxygen defective portion of the capacitor dielectric film 17.

Figure 5F:
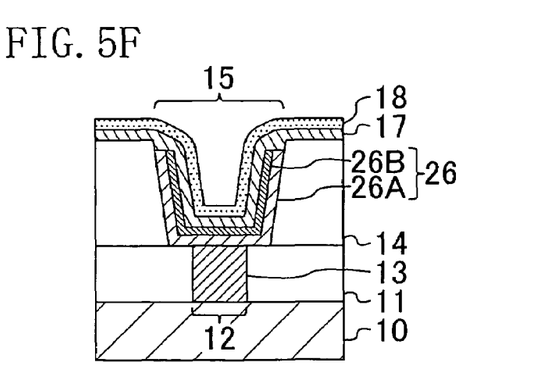

Next, in the procedure shown in FIG. 5F, an upper electrode material film 18 made of, for example, a titanium nitride film or the like with a thickness of approximately 50 nm is formed on the capacitor dielectric film 17, and although not shown in the drawings, the upper electrode material film 18 is processed into a desired shape so as to be formed into an upper electrode.

Through the aforementioned procedures, an MIM capacitor of this embodiment composed of the lower electrode 26 made of the multilayered film of the tantalum nitride film 26A with low resistance formed by the ALD and the amorphous tantalum nitride film 26B formed by the MOCVD; the amorphous capacitor dielectric film 17 formed on the lower electrode 26; and the upper electrode formed on the capacitor dielectric film 17 can be formed on the semiconductor substrate 10.

According to Embodiment 2, since crystallization of the $HfO_x$ film used as the capacitor dielectric film 17 can be suppressed in the same manner as in Embodiment 1, the leakage current can be smaller than in the conventional MIM capacitor. Specifically, in the MIM capacitor of Embodiment 2, $HfO_x$ is deposited on the lower electrode 26 formed by successively stacking the tantalum nitride film 26A formed by the ALD and the amorphous tantalum nitride film 26B formed by the MOCVD. In this case, the tantalum nitride film 26B formed by the MOCVD as the upper portion of the lower electrode 26 is amorphous. Therefore, the $HfO_x$ deposited on the tantalum nitride film 26B in the amorphous state does not grow as crystal but is formed as an amorphous film because the underlying tantalum nitride film 26B is amorphous. Accordingly, the capacitor dielectric film 17 can attain a high dielectric constant and the capacitor leakage current passing a grain boundary can be suppressed in the MIM capacitor. Also, since the crystallization of the capacitor dielectric film 17 can be prevented, the capacitor dielectric film 17 can be made of merely the $HfO_x$ film, that is, a high dielectric constant film with a high dielectric constant. Accordingly, the physical thickness of the capacitor dielectric film 17 can be kept to some extent while securing a capacitance value, and hence, a leakage current derived from the tunnel effect can be suppressed.

It is noted that TaN (tantalum nitride) used as the lower electrode 26 in Embodiment 2 is a material widely used as a barrier metal for a Cu (copper) interconnect. Therefore, the lower electrode 26 of this embodiment is applicable not only to an MIM capacitor to be used in a memory such as a DRAM as described in this embodiment but also to an MIM capacitor which is formed on a Cu interconnect and is to be used in an analog circuit.

Furthermore, although the MIM capacitor is formed in the recess provided in the insulating film on the substrate in each of Embodiments 1 and 2, the invention is applicable to another type of MIM capacitor instead.

Although the titanium nitride film or the tantalum nitride film is used as the lower electrode in each of Embodiments 1 and 2, the lower electrode may be made of any of metals, metal oxides and metal nitrides. Specifically, the lower electrode may be made of at least one of TiN, TaN, Ti, Al, W, WN, Pt, Ir and Ru. Also, the upper portion and the rest portion of the lower electrode are made of the same material in each of Embodiments 1 and 2, different materials may be respectively used for these portions.

Although the high dielectric constant film of $HfO_x$ is used as the capacitor dielectric film in each of Embodiments 1 and 2, the capacitor dielectric film may be made of an insulating metal oxide such as a Hf oxide or a Zr oxide. Specifically, the capacitor dielectric film may include at least one of or two or more of metal oxides such as $HfO_x$, $TaO_x$, $AlO_x$, $ZrO_x$, STO ($SrTiO_x$), BST($(Ba,Sr)TiO_x$) and PZT($Pb(Zr,Ti)O_x$).

What is claimed is:

1. A semiconductor device comprising a capacitor formed by successively stacking a lower electrode, a capacitor dielectric film and an upper electrode in a hole of a first insulating film on a substrate,
   wherein said lower electrode includes a first conducting layer formed in the hole of said first insulating film along to a side surface and a bottom surface of said hole and a second conducting layer formed in contact with said first conducting layer along to the shape of said first conducting layer,
   said first conducting layer and said second conducting layer are made of at least one of a metal, metal oxide and a metal nitride,
   said second conducting layer is amorphous, and
   said capacitor dielectric film is amorphous and formed in contact with said second conducting layer of said lower electrode.

2. The semiconductor device of claim 1,
   wherein said capacitor dielectric film is made of an insulating metal oxide.

3. The semiconductor device of claim 1,
   wherein said capacitor dielectric film is made of a Hf oxide or a Zr oxide.

4. The semiconductor device of claim 1,
   wherein said second conducting layer has higher resistivity than said first conducting layer.

5. The semiconductor device of claim 1,
wherein said second conducting layer of said lower electrode is a conducting film that is formed by MOCVD and has not been subjected to plasma processing for reducing resistance thereof.

6. The semiconductor device of claim 1,
wherein said first conducting layer of said lower electrode is a conducting film that is formed by MOCVD and has been subjected to plasma processing for reducing resistance thereof.

7. The semiconductor device of claim 1,
wherein said first conducting layer of said lower electrode is a conducting film formed by ALD.

8. The semiconductor device of claim 1,
wherein said first conducting layer and said second conducting layer of said lower electrode are titanium nitride films.

9. The semiconductor device of claim 1,
wherein said first conducting layer and said second conducting layer of said lower electrode are tantalum nitride films.

10. A method for fabricating a semiconductor device including a capacitor formed by successively stacking a lower electrode, a capacitor dielectric film and an upper electrode in a hole of a first insulating film on a substrate, comprising the steps of:
(x) forming said first insulating film on said substrate;
(y) forming said hole in said first insulating layer;
(a) forming, on said substrate and along to a side surface and a bottom surface of said hole, a first conducting layer corresponding to a part of said lower electrode;
(b) forming, in contact with said first conducting layer and along to the shape of said first conducting layer, a second conducting layer corresponding to another part of said lower electrode,
said first conducting layer and said second conducting layer being made of at least one of a metal, metal oxide and a metal nitride,
said second conducting layer of said lower electrode being amorphous; and
(c) forming said capacitor dielectric film on said second conducting layer so as to be in contact with said second conducting layer, said capacitor dielectric film being amorphous.

11. The method for fabricating a semiconductor device of claim 10,
wherein said first conducting layer is subjected to a treatment using plasma including a hydrogen ion and a nitrogen ion for reducing resistance of said first conducting layer after forming said first conducting layer by MOCVD in the step (a), and
said second conducting layer is not subjected to the treatment using the plasma after forming said second conducting layer by the MOCVD in step (b).

12. The method for fabricating a semiconductor device of claim 10, wherein said first conducting layer is formed by ALD in the step (a), and said second conducting layer is formed by CVD in the step (b).

13. The method for fabricating a semiconductor device of claim 10, wherein said capacitor dielectric film is made of an insulating metal oxide.

14. The method for fabricating a semiconductor device of claim 10,
wherein said second conducting layer has higher resistivity than said first conducting layer.

15. The method for fabricating a semiconductor device of claim 10,
wherein said second conducting layer is deposited using MOCVD in the step (b).

16. The method for fabricating a semiconductor device of claim 10,
wherein said first conducting layer is deposited using ALD in the step (a).

17. The method for fabricating a semiconductor device of claim 10,
wherein said first conducting layer is a titanium nitride film in the step (a), and
said second conducting layer is a titanium nitride film in the step (b).

18. The method for fabricating a semiconductor device of claim 10,
wherein said first conducting layer is a tantalum nitride film in the step (a), and
said second conducting layer is a tantalum nitride film in the step (b).

19. The semiconductor device of claim 1, further comprising:
a conducting plug of tungsten formed on said substrate which connects said substrate and said lower electrode.

20. The semiconductor device of claim 1, further comprising:
a conducting plug of titanium formed on said substrate which connects said substrate and said lower electrode.

21. The semiconductor device of claim 1, further comprising:
a conducting plug of titanium nitride formed on said substrate which connects said substrate and said lower electrode.

22. The semiconductor device of claim 1, wherein said first conducting layer has a thickness of approximately 15 nm.

23. The semiconductor device of claim 1, wherein said second conducting layer has a thickness of approximately 5 nm.

24. The semiconductor device of claim 1, wherein said first conducting layer has a resistivity as high as approximately 200 $\mu\Omega\cdot cm$.

25. The semiconductor device of claim 1, wherein said second conducting layer has a resistivity as high as approximately 700 $\mu\Omega\cdot cm$.

26. The semiconductor device of claim 1, wherein said capacitor dielectric film is formed by ALD.

27. The semiconductor device of claim 1, wherein said capacitor dielectric film has a thickness of approximately 6 nm.

28. The semiconductor device of claim 1, wherein said upper electrode is made of a titanium nitride.

29. The semiconductor device of claim 1, wherein said upper electrode has a thickness of approximately 50 nm.

30. The semiconductor device of claim 9, wherein said first conducting layer has a resistivity as high as approximately 350 $\mu\Omega\cdot cm$.

31. The semiconductor device of claim 9, wherein said second conducting layer has a resistivity as high as approximately 1000 $\mu\Omega\cdot cm$.

32. The semiconductor device of claim 1, wherein said lower electrode is made of Ti.

33. The semiconductor device of claim 1, wherein said lower electrode is made of Al.

34. The semiconductor device of claim 1, wherein said lower electrode is made of W.

35. The semiconductor device of claim 1, wherein said lower electrode is made of WN.

36. The semiconductor device of claim 1, wherein said lower electrode is made of Pt.

37. The semiconductor device of claim 1, wherein said lower electrode is made of Ir.

38. The semiconductor device of claim 1, wherein said lower electrode is made of Ru.

39. The semiconductor device of claim 1, wherein said capacitor dielectric film is made of $TaO_x$.

40. The semiconductor device of claim 1, wherein said capacitor dielectric film is made of $AlO_x$.

41. The semiconductor device of claim 1, wherein said capacitor dielectric film is made of STO.

42. The semiconductor device of claim 1, wherein said capacitor dielectric film is made of BST.

43. The semiconductor device of claim 1, wherein said capacitor dielectric film is made of PZT.

\* \* \* \* \*